(12) United States Patent
Mihara et al.

(10) Patent No.: US 10,233,274 B2
(45) Date of Patent: Mar. 19, 2019

(54) CURABLE COMPOSITION AND PATTERNING METHOD USING THE SAME

(71) Applicant: CANON KABUSHIKI KAISHA, Tokyo (JP)

(72) Inventors: Chieko Mihara, Isehara (JP); Toshiki Ito, Kawasaki (JP); Motoki Okinaka, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 670 days.

(21) Appl. No.: 14/406,028

(22) PCT Filed: May 21, 2013

(86) PCT No.: PCT/JP2013/064560
§ 371 (c)(1),
(2) Date: Dec. 5, 2014

(87) PCT Pub. No.: WO2013/183467
PCT Pub. Date: Dec. 12, 2013

(65) Prior Publication Data
US 2015/0152208 A1 Jun. 4, 2015

(30) Foreign Application Priority Data

Jun. 6, 2012 (JP) .................................. 2012-128996

(51) Int. Cl.
*C08F 2/44* (2006.01)
*C08F 2/50* (2006.01)
(Continued)

(52) U.S. Cl.
CPC ........ *C08F 222/1006* (2013.01); *B82Y 10/00* (2013.01); *B82Y 40/00* (2013.01);
(Continued)

(58) Field of Classification Search
None
See application file for complete search history.

(56) References Cited

U.S. PATENT DOCUMENTS 2,723,999 A * 11/1955 Madison ............... C07C 43/11
568/615
2002/0103538 A1* 8/2002 Hughes ................. A61L 15/24
623/6.59
(Continued)

FOREIGN PATENT DOCUMENTS

CN  1799805 A  7/2006
CN  1972966 A  5/2007
(Continued)

OTHER PUBLICATIONS

Machine translation of JP 2008-019292 (2008).*
Scheer, "Pattern definition by nanoimprint", Proc. SPIE vol. 8428 842801 15 pages (May 2012).*

*Primary Examiner* — Martin J Angebranndt
(74) *Attorney, Agent, or Firm* — Canon U.S.A., Inc. IP Division

(57) ABSTRACT

A curable composition contains a polymerizable compound and a polymerization initiator. The polymerization initiator initiates polymerization to cure the polymerizable compound. The curable composition further contains compounds having the following general formulae (1) and (2):

[Chem. 1]

(1)

[Chem. 2]

(2)

(Continued)

wherein X1 is selected from a hydroxy group, a carboxy group, a sulfo group, an amino group, and an alkoxy group, l1 denotes an integer in the range of 0 to 7, m1 denotes an integer in the range of 1 to 5, and n1 denotes an integer in the range of 1 to 16, and X2 is selected from a hydroxy group, a carboxy group, a sulfo group, an amino group, and an alkoxy group, l2 denotes an integer in the range of 0 to 7, m2 denotes an integer in the range of 1 to 5, and n2 denotes an integer in the range of 1 to 16.

12 Claims, 2 Drawing Sheets

(51) Int. Cl.
  *G03F 7/00* (2006.01)
  *G03F 7/11* (2006.01)
  *B82Y 10/00* (2011.01)
  *B82Y 40/00* (2011.01)
  *C08F 20/18* (2006.01)
  *G03F 7/004* (2006.01)
  *G03F 7/027* (2006.01)
  *C08F 222/10* (2006.01)
(52) U.S. Cl.
  CPC .......... *C08F 2/44* (2013.01); *C08F 2/50* (2013.01); *G03F 7/0002* (2013.01); *G03F 7/0046* (2013.01); *G03F 7/027* (2013.01); *G03F 7/11* (2013.01); *C08F 20/18* (2013.01); *C08F 2222/1013* (2013.01); *Y10T 428/24802* (2015.01)

(56) References Cited

U.S. PATENT DOCUMENTS

| | | | | |
|---|---|---|---|---|
| 2004/0017451 A1* | 1/2004 | Takabayashi | ........ | B41J 2/17509 347/100 |
| 2005/0113483 A1* | 5/2005 | Takabayashi | .......... | C09D 11/30 523/160 |
| 2006/0063112 A1 | 3/2006 | Sreenivasan | | |
| 2007/0231735 A1* | 10/2007 | Pawlowski | ............. | G03F 7/027 430/270.1 |
| 2008/0110557 A1 | 5/2008 | Xu | | |
| 2011/0215503 A1 | 9/2011 | Xu | | |
| 2012/0004385 A1* | 1/2012 | Kodama | ................ | B82Y 10/00 526/320 |
| 2013/0258012 A1* | 10/2013 | Boris | ................... | C09D 11/322 347/100 |
| 2014/0065367 A1* | 3/2014 | Matsumoto | .............. | G02B 1/04 428/141 |
| 2017/0066208 A1* | 3/2017 | Khusnatdinov | .. | B29D 11/00865 |
| 2017/0068159 A1* | 3/2017 | Khusnatdinov | ....... | G03F 7/0002 |
| 2017/0068161 A1* | 3/2017 | Stachowiak | .......... | G03F 7/0002 |
| 2017/0282440 A1* | 10/2017 | Stachowiak | .......... | G03F 7/0002 |
| 2017/0285479 A1* | 10/2017 | Stachowiak | .......... | G03F 7/161 |
| 2017/0371240 A1* | 12/2017 | Liu | ........................ | G03F 7/0002 |

FOREIGN PATENT DOCUMENTS

| | | |
|---|---|---|
| CN | 101154042 A | 4/2008 |
| EP | 51527 | * 10/1981 |
| JP | 03-290430 | * 12/1991 |
| JP | H093358 A | 1/1997 |
| JP | 2008019292 A | 1/2008 |
| JP | 2008-178984 A | 8/2008 |
| JP | 2010-016149 A | 1/2010 |
| JP | 2010-106185 A | 5/2010 |
| JP | 2010-113170 A | 5/2010 |
| JP | 4791357 B2 | 10/2011 |
| JP | 2012-207169 A | 10/2012 |
| WO | 2011-152216 | * 12/2011 |
| WO | 2013069511 A1 | 5/2013 |

* cited by examiner

CURABLE COMPOSITION AND PATTERNING METHOD USING THE SAME

TECHNICAL FIELD

The present invention relates to a curable composition and a patterning method using the curable composition.

BACKGROUND ART

A UV nanoimprint method is a patterning method of pressing a mold having a fine textured pattern on its surface against a substrate coated with a resist (photo-curable composition) and curing the resist to transfer the textured pattern to the resist film on the substrate.

It is important in the UV nanoimprint method to decrease the force with which the mold is released from cured resist, that is, demolding force. This is because a large demolding force may cause defects in the pattern or may cause the substrate to rise from the stage, resulting in low alignment precision.

A known curable composition for use in UV nanoimprint contains at least one polymerizable monomer, a polymerization initiator, and a fluorinated surfactant.

PTL 1 discloses a resist composition that contains a fluorinated surfactant having a hydrophilic ethylene oxide group (EO group) structure. PTL 1 discloses a resist composition that contains a fluorinated surfactant having an EO group structure so as to improve adhesion and mold releasability.

PTL 2 discloses a resist composition that contains a fluorinated surfactant having a chemical structure having a lipophilic propylene oxide group (PO group).

PTL 2 also discloses a resist composition that contains a fluorinated surfactant having both an EO group and a PO group in its molecular.

As described above, it is known that a fluorinated material may be added to a curable composition to impart water repellency to a surface of a photo-cured film and decrease demolding force. However, the addition of a known fluorinated material alone still results in a large demolding force.

Furthermore, an excessive addition of a fluorinated surfactant to reduce demolding force results in a decrease in surface tension and poor filling in a substrate or a mold.

CITATION LIST

Patent Literature

PTL 1 U.S. Patent Application Publication No. 2011/0215503
PTL 2 Japanese Patent No. 4791357

SUMMARY OF INVENTION

Technical Problem

In view of such problems of the related art, the present invention provides a curable composition that requires a small demolding force and is easy to charge. The present invention also provides a patterning method that realizes satisfactory filling and requires a small demolding force.

Solution to Problem

In order to solve the problems described above, a curable composition according to one aspect of the present invention contains a polymerizable compound and a polymerization initiator, wherein the polymerization initiator initiates polymerization to cure the polymerizable compound, and the curable composition further contains at least a compound having the following general formula (1) and a compound having the following general formula (2).

[Chem. 1]

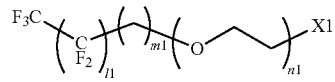

(1)

[Chem. 2]

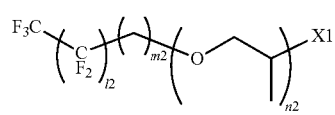

(2)

In the general formula (1), X1 denotes a functional group selected from the group consisting of a hydroxy group, a carboxy group, a sulfo group, an amino group, and alkoxy groups, l1 denotes an integer in the range of 0 to 7, m1 denotes an integer in the range of 1 to 5, and n1 denotes an integer in the range of 1 to 16. In the general formula (2), X2 denotes a functional group selected from the group consisting of a hydroxy group, a carboxy group, a sulfo group, an amino group, and alkoxy groups, l2 denotes an integer in the range of 0 to 7, m2 denotes an integer in the range of 1 to 5, and n2 denotes an integer in the range of 1 to 16.

A patterning method according to another aspect of the present invention includes placing the curable composition on the substrate, bringing the curable composition into contact with a mold, irradiating the curable composition with light, and releasing the cured composition from the mold.

Further features of the present invention will become apparent from the following description of exemplary embodiments with reference to the attached drawings.

DESCRIPTION OF EMBODIMENTS

Figure 1A:
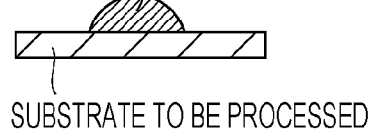
FIG. 1 is a cross-sectional view illustrating a patterning method.
Figure 1B:
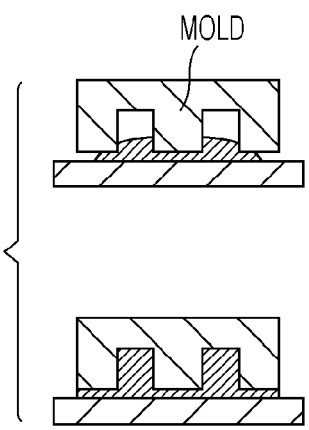
Figure 1C:
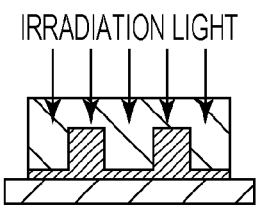
Figure 1D:
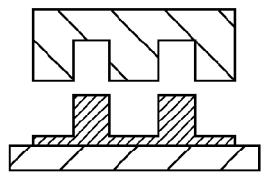
Figure 1E:
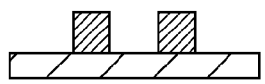
Figure 1F:
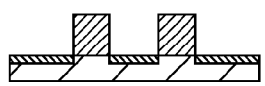

The present invention will be further described in the following embodiments. The present invention is not limited to these embodiments. It will be recognized by those skilled in the art that variations and modifications may be made to these embodiments without departing from the gist of the present invention. These variations and modifications are also intended to be within the scope of the present invention.

The term "patterning method", as used herein, includes a UV imprint method. The UV imprint method is preferably a patterning method on the order of 1 nm to 10 mm, more preferably approximately 1 nm to 100 µm. A technique of forming a nanoscale (1 to 100 nm) pattern (textured structure) is generally referred to as UV nanoimprint. The present invention includes UV nanoimprint.

A curable composition according to an embodiment of the present invention contains a polymerizable compound and a polymerization initiator. The polymerization initiator initiates polymerization to cure the polymerizable compound. The curable composition further contains at least a compound having the following general formula (1) and a compound having the following general formula (2).

[Chem. 3]

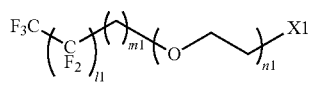
(1)

[Chem. 4]

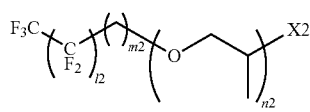
(2)

In the general formula (1), X1 denotes a functional group selected from the group consisting of a hydroxy group, a carboxy group, a sulfo group, an amino group, and alkoxy groups, l1 denotes an integer in the range of 0 to 7, m1 denotes an integer in the range of 1 to 5, and n1 denotes an integer in the range of 1 to 16. In the general formula (2), X2 denotes a functional group selected from the group consisting of a hydroxy group, a carboxy group, a sulfo group, an amino group, and alkoxy groups, l2 denotes an integer in the range of 0 to 7, m2 denotes an integer in the range of 1 to 5, and n2 denotes an integer in the range of 1 to 16.

X1 in the general formula (1) and X2 in the general formula (2) denote a polar functional group selected from the group consisting of a hydroxy group, a carboxy group, a sulfo group, an amino group, and alkoxy groups. Examples of the alkoxy groups include a methoxy group, an ethoxy group, a propoxy group, and a butoxy group.

A compound in which X1 and X2 are hydroxy groups is suitable for the preparation of a solution and is therefore employed in the present embodiments. More specifically, a curable composition according to the present embodiments contains (a) a polymerizable compound, (b) a photopolymerization initiator, (c) a compound having the general formula (3), and (d) a compound having the general formula (4).

[Chem. 5]

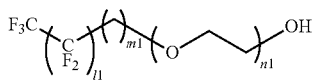
(3)

[Chem. 6]

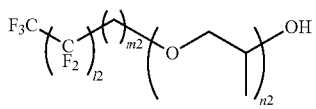
(4)

In the general formula (1), l1 denotes an integer in the range of 0 to 7, m1 denotes an integer in the range of 1 to 5, and n1 denotes an integer in the range of 1 to 16. In the general formula (2), l2 denotes an integer in the range of 0 to 7, m2 denotes an integer in the range of 1 to 5, and n2 denotes an integer in the range of 1 to 16.

The curable composition may contain another additive component.

A curable composition according to an embodiment of the present invention is characterized in that the coexistence of the compounds having the general formula (1) and the general formula (2) can suppress a decrease in surface tension even when the amount of mold-release agent added is increased.

In existing compositions containing a single fluorinated surfactant, for example, as disclosed in PTL 2, an increase in the amount of fluorinated surfactant added tends to result in a decrease in surface tension and markedly poor filling.

The present inventors completed the present invention by finding that a composition containing fluorinated surfactants having the general formula (1) and the general formula (2) can have improved mold releasability while suppressing a decrease in surface tension rather than a trade-off between mold releasability and surface tension.

The suppression of a decrease in surface tension associated with an increase in the amount of fluorinated surfactant added increases flexibility in adjusting the material composition.

Unlike PTL 2, not having the EO group and the PO group in its molecule, the fluorinated surfactants can be easily synthesized at low cost. It is easy to change the addition (blend) ratio of the fluorinated surfactants and control characteristics.

The compound having the general formula (1) may constitute 0.1% to 5% by weight, and the compound having the general formula (2) may constitute 0.01% to 5% by weight.

The weight ratio of the compound having the general formula (1) to the compound having the general formula (2) in the curable composition is preferably in the range of 0.1 to 50, more preferably 0.5 to 15, still more preferably 1 to 5.

It is not clear why a composition according to the present invention can satisfy both a small demolding force and the suppression of a decrease in surface tension.

A surface analysis, for example, XPS showed that the compounds having the general formulae (1) and (2) for use in the present invention segregate on a surface of a cured product. Thus, the fluorinated surfactants may form a detachable interface and reduce demolding force. The fluorinated surfactants for use in the present invention have a lower molecular weight and a higher degree of segregation on the detachable interface than the fluorinated surfactant disclosed in PTL 2.

The compound having the general formula (1) having a more hydrophilic ethylene oxide group (EO group) structure is mixed with the compound having the general formula (2) having a chemical structure containing a more lipophilic propylene oxide group (PO group).

The present inventors suppose that the compound having the general formula (1) tends to distribute on the hydrophilic mold side, and the compound having the general formula (2) tends to distribute on the resist side. In addition to the terminal polar functional groups, the coexistence of the compound having the hydrophilic EO group and the compound having the lipophilic PO group may form a structure close to a multilayer thin film having a controlled interface or a thin film having a graded structure, thereby reducing demolding force. In particular, an increase in the amount of lipophilic compound having the general formula (2) on the resist side may result in an increase in the amount of hydrophilic compound having the general formula (1) on the mold surface, thereby facilitating the formation of a thin film having a controlled interface.

A resist before photo-curing contains two fluorinated surfactants: the compound having the general formula (1)

and the compound having the general formula (2). Thus, the packing of the fluorine portions may be weakened. This may suppress a decrease in surface tension and improve filling.

A patterning technique, exemplified by UV nanoimprint, involves imprinting a curable composition between a mold generally made of quartz and a substrate, such as a silicon wafer, and photo-curing the curable composition. After curing a curable composition according to an embodiment of the present invention, well-balanced coexistence of the hydrophilic EO group and the lipophilic PO group allows the interface structure to be suitably controlled.

Because of the behavior of such a mechanism, the novel photo-curable composition can realize both satisfactory filling and mold releasability.

The compound having the general formula (1) may be more than the compound having the general formula (2). This helps the amount of compound having the general formula (1) that distributes on the mold side to agree with the amount of compound having the general formula (2) that distributes on the resist side.

As described below in the synthesis example 1, the compound having the general formula (1) may be hexa(ethylene glycol) mono-1H,1H-perfluoroheptyl ether ($CF_3(CF_2)_5CH_2(OCH_2CH_2)_6OH$).

A desired compound having the general formula (1) can be synthesized with reference to the synthesis example 1 by appropriately changing the starting materials A and B.

As described below in the synthesis example 2, the compound having the general formula (2) may be tri(propylene glycol) mono-1H,1H-perfluoroheptyl ether ($CF_3(CF_2)_5CH_2(OCH_2CH(CH_3))_3$—OH).

A desired compound having the general formula (2) can be synthesized with reference to the synthesis example 2 by appropriately changing the starting materials C and D.

The compounds having the general formulae (1) and (2) have a perfluoroalkyl chain. Specific examples of the perfluoroalkyl chain include a perfluoromethyl group, a perfluoroethyl group, a perfluoropropyl group, a perfluorobutyl group, a perfluoropentyl group, a perfluorohexyl group, and a perfluoroheptyl group. From the environmental compatibility point of view, the number of carbon atoms may be seven or less.

The amount of each of the (c) component (the compound having the general formula (1)) and the (d) component (the compound having the general formula (2)) may be in the range of 0.001% to 5% by weight, preferably 0.002% to 4% by weight, more preferably 0.005% to 3% by weight, of the total amount of curable composition.

(Polymerizable Compound (a))

The polymerizable compound of a curable composition according to an embodiment of the present invention may be a polymerizable monomer, such as a radical-polymerizable monomer or a cation-polymerizable monomer.

The radical-polymerizable monomer may be a compound having at least one acryloyl or methacryloyl group. The cation-polymerizable monomer may be a compound having at least one vinyl ether group, epoxy group, or oxetanyl group.

(Polymerizable Monomer (a): Radical-Polymerizable Component)

Examples of a monofunctional (meth)acryl compound having one acryloyl or methacryloyl group include, but are not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenol (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth)acrylate, 2-ethyl-2-adamantyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloylmorpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth)acrylate, tetrahydrofurfuryl (meth)acrylate, butoxyethyl (meth)acrylate, ethoxydiethylene glycol (meth)acrylate, poly(ethylene glycol) mono(meth)acrylate, poly(propylene glycol) mono(meth)acrylate, methoxyethylene glycol (meth)acrylate, ethoxyethyl (meth)acrylate, methoxy poly(ethylene glycol) (meth)acrylate, methoxy poly(propylene glycol) (meth)acrylate, diacetone (meth)acrylamide, isobutoxymethyl(meth)acrylamide, N,N-dimethyl(meth)acrylamide, t-octyl(meth)acrylamide, dimethylaminoethyl (meth)acrylate, diethylaminoethyl (meth)acrylate, 7-amino-3,7-dimethyloctyl (meth)acrylate, N,N-diethyl(meth)acrylamide, and N,N-dimethylaminopropyl (meth)acrylamide.

The monofunctional (meth)acryl compound may be, but is not limited to, the following product: Aronix M101, M102, M110, M111, M113, M117, M5700, TO-1317, M120, M150, or M156 (manufactured by Toagosei Co., Ltd.), MEDOL 10, MIBDOL 10, CHDOL 10, MMDOL 30, MEDOL 30, MIBDOL 30, CHDOL 30, LA, IBXA, 2-MTA, HPA, or Viscoat #150, #155, #158, #190, #192, #193, #220, #2000, #2100, or #2150 (manufactured by Osaka Organic Chemical Industry Ltd.), Light Acrylate BO-A, EC-A, DMP-A, THF-A, HOP-A, HOA-MPE, HOA-MPL, PO-A, P-200A, NP-4EA, or NP-8EA, or epoxy ester M-600A (manufactured by Kyoeisha Chemical Co., Ltd.), Kayarad TC110S, R-564, or R-128H (manufactured by Nippon Kayaku Co., Ltd.), NK ester AMP-10G or AMP-20G (manufactured by Shin Nakamura Chemical Co., Ltd.), FA-511A, 512A, or 513A (manufactured by Hitachi Chemical Co., Ltd.), PHE, CEA, PHE-2, PHE-4, BR-31, BR-31M, or BR-32 (manufactured by Dai-ichi Kogyo Seiyaku Co., Ltd.), VP (manufactured by BASF), or ACMO, DMAA, or DMAPAA (manufactured by Kohjin Co., Ltd.).

Examples of a polyfunctional (meth)acryl compound having at least two acryloyl or methacryloyl groups include, but are not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, pentaerythritol tri(meth)acrylate, pentaerythritol tetra(meth)acrylate, ethylene glycol di(meth)acrylate, tetra(ethylene glycol) di(meth)acrylate, poly(ethylene glycol) di(meth)acrylate, poly(propylene glycol) di(meth)acrylate, 1,4-butanediol di(meth)acrylate, 1,6-hexanediol di(meth)acrylate, neopentyl glycol di(meth)acrylate, tris(2-hydroxyethyl)isocyanurate tri(meth)acrylate, tris (acryloyloxy)isocyanurate, bis(hydroxymethyl) tricyclodecane di(meth)acrylate, dipentaerythritol penta (meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, and EO,PO-modified 2,2-bis(4-((meth)acryloxy)phenyl) propane.

The polyfunctional (meth)acryl compound may be, but is not limited to, the following product: Yupimer UV SA1002 or SA2007 (manufactured by Mitsubishi Chemical Corp.), Viscoat #195, #230, #215, #260, #335HP, #295, #300, #360, #700, GPT, or 3PA (manufactured by Osaka Organic Chemical Industry Ltd.), Light Acrylate 4EG-A, 9EG-A, NP-A, DCP-A, BP-4EA, BP-4PA, TMP-A, PE-3A, PE-4A, or DPE-6A (manufactured by Kyoeisha Chemical Co., Ltd.), Kayarad PET-30, TMPTA, R-604, DPHA, DPCA-20, -30, -60, or -120, HX-620, D-310, or D-330 (manufactured by Nippon Kayaku Co., Ltd.), Aronix M208, M210, M215, M220, M240, M305, M309, M310, M315, M325, or M400 (manufactured by Toagosei Co., Ltd.), or Ripoxy VR-77, VR-60, or VR-90 (manufactured by Showa Highpolymer Co., Ltd.).

These radical-polymerizable monomers may be used alone or in combination. The term "(meth)acrylate", as used herein, refers to an acrylate and its corresponding methacrylate. The term "(meth)acryloyl group", as used herein, refers to an acryloyl group and its corresponding methacryloyl group. EO denotes ethylene oxide, and an EO-modified compound has a block structure of an ethylene oxide group. PO denotes propylene oxide, and a PO-modified compound has a block structure of a propylene oxide group.

(Polymerizable Monomer (a): Cation-Polymerizable Component)

Examples of a compound having one vinyl ether group include, but are not limited to, methyl vinyl ether, ethyl vinyl ether, propyl vinyl ether, n-butyl vinyl ether, t-butyl vinyl ether, 2-ethylhexyl vinyl ether, n-nonyl vinyl ether, lauryl vinyl ether, cyclohexyl vinyl ether, cyclohexylmethyl vinyl ether, 4-methylcyclohexylmethyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxy poly(ethylene glycol) vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, poly(ethylene glycol) vinyl ether, chloroethyl vinyl ether, chlorobutyl vinyl ether, chloroethoxyethyl vinyl ether, phenylethyl vinyl ether, and phenoxy poly(ethylene glycol) vinyl ether.

Examples of a compound having at least two vinyl ether groups include, but are not limited to, divinyl ethers, such as ethylene glycol divinyl ether, diethylene glycol divinyl ether, poly(ethylene glycol) divinyl ether, propylene glycol divinyl ether, butylene glycol divinyl ether, hexanediol divinyl ether, bisphenol A alkylene oxide divinyl ethers, and bisphenol F alkylene oxide divinyl ethers; and polyfunctional vinyl ethers, such as trimethylolethane trivinyl ether, trimethylolpropane trivinyl ether, ditrimethylolpropane tetravinyl ether, glycerin trivinyl ether, pentaerythritol tetravinyl ether, dipentaerythritol pentavinyl ether, dipentaerythritol hexavinyl ether, ethylene oxide adducts of trimethylolpropane trivinyl ether, propylene oxide adducts of trimethylolpropane trivinyl ether, ethylene oxide adducts of ditrimethylolpropane tetravinyl ether, propylene oxide adducts of ditrimethylolpropane tetravinyl ether, ethylene oxide adducts of pentaerythritol tetravinyl ether, propylene oxide adducts of pentaerythritol tetravinyl ether, ethylene oxide adducts of dipentaerythritol hexavinyl ether, and propylene oxide adducts of dipentaerythritol hexavinyl ether.

Examples of a compound having one epoxy group include, but are not limited to, phenyl glycidyl ether, p-tert-butylphenyl glycidyl ether, butyl glycidyl ether, 2-ethylhexyl glycidyl ether, allyl glycidyl ether, 1,2-butylene oxide, 1,3-butadiene monoxide, 1,2-epoxidedecane, epichlorohydrin, 1,2-epoxydecane, styrene oxide, cyclohexene oxide, 3-methacryloyloxymethylcyclohexene oxide, 3-acryloyloxymethylcyclohexene oxide, and 3-vinylcyclohexene oxide.

Examples of a compound having at least two epoxy groups include, but are not limited to, bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolak resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexane carboxylate, 2-(3,4-epoxycyclohexyl-5,5-spiro-3,4-epoxy)cyclohexane-meta-dioxane, bis(3,4-epoxycyclohexylmethyl) adipate, vinylcyclohexene oxide, 4-vinylepoxycyclohexane, bis(3,4-epoxy-6-methylcyclohexylmethyl) adipate, 3,4-epoxy-6-methylcyclohexyl-3',4'-epoxy-6'-methylcyclohexane carboxylate, methylene bis(3,4-epoxycyclohexane), dicyclopentadiene diepoxide, ethylene glycol di(3,4-epoxycyclohexylmethyl) ether, ethylene bis(3,4-epoxycyclohexane carboxylate), epoxyhexahydrodioctyl phthalate, epoxyhexahydrodi-2-ethylhexyl phthalate, 1,4-butanediol diglycidyl ether, 1,6-hexanediol diglycidyl ether, glycerin triglycidyl ether, trimethylolpropane triglycidyl ether, poly (ethylene glycol) diglycidyl ether, poly(propylene glycol) diglycidyl ether, 1,1,3-tetradecadiene dioxide, limonene dioxide, 1,2,7,8-diepoxyoctane, and 1,2,5,6-diepoxycyclooctane.

Examples of a compound having one oxetanyl group include, but are not limited to, 3-ethyl-3-hydroxymethyloxetane, 3-(meta)allyloxymethyl-3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl (3-ethyl-3-oxetanylmethyl) ether, isobornyloxyethyl (3-ethyl-3-oxetanylmethyl) ether, isobornyl (3-ethyl-3-oxetanylmethyl) ether, 2-ethylhexyl (3-ethyl-3-oxetanylmethyl) ether, ethyldiethylene glycol (3-ethyl-3-oxetanylmethyl) ether, dicyclopentadiene (3-ethyl-3-oxetanylmethyl) ether, dicyclopentenyloxyethyl (3-ethyl-3-oxetanylmethyl) ether, dicyclopentenyl (3-ethyl-3-oxetanylmethyl) ether, tetrahydrofurfuryl (3-ethyl-3-oxetanylmethyl) ether, tetrabromophenyl (3-ethyl-3-oxetanylmethyl) ether, 2-tetrabromophenoxyethyl (3-ethyl-3-oxetanylmethyl) ether, tribromophenyl (3-ethyl-3-oxetanylmethyl) ether, 2-tribromophenoxyethyl (3-ethyl-3-oxetanylmethyl) ether, 2-hydroxyethyl (3-ethyl-3-oxetanylmethyl) ether, 2-hydroxypropyl (3-ethyl-3-oxetanylmethyl) ether, butoxyethyl (3-ethyl-3-oxetanylmethyl) ether, pentachlorophenyl (3-ethyl-3-oxetanylmethyl) ether, pentabromophenyl (3-ethyl-3-oxetanylmethyl) ether, and bornyl (3-ethyl-3-oxetanylmethyl) ether.

Examples of a compound having at least two oxetanyl groups include, but are not limited to, polyfunctional oxetanes, such as 3,7-bis(3-oxetanyl)-5-oxa-nonane, 3,3'-(1,3-(2-methylenyl)propanediyl bis(oxymethylene))bis-(3-ethyloxetane), 1,4-bis[(3-ethyl-3-oxetanylmethoxy)methyl] benzene, 1,2-bis[(3-ethyl-3-oxetanylmethoxy)methyl] ethane, 1,3-bis[(3-ethyl-3-oxetanylmethoxy)methyl] propane, ethylene glycol bis(3-ethyl-3-oxetanylmethyl) ether, dicyclopentenyl bis(3-ethyl-3-oxetanylmethyl) ether, tri(ethylene glycol) bis(3-ethyl-3-oxetanylmethyl) ether, tetra(ethylene glycol) bis(3-ethyl-3-oxetanylmethyl) ether, tricyclodecanediyldimethylene (3-ethyl-3-oxetanylmethyl) ether, trimethylolpropane tris(3-ethyl-3-oxetanylmethyl) ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl) ether, pentaerythritol tetrakis(3-ethyl-3-oxetanylmethyl) ether, poly(ethylene glycol) bis(3-ethyl-3-oxetanylmethyl) ether, dipentaerythritol hexakis(3-ethyl-3-oxetanylmethyl) ether, dipentaerythritol pentakis(3-ethyl-3-oxetanylmethyl) ether, dipentaerythritol tetrakis(3-ethyl-3-oxetanylmethyl) ether, caprolactone-modified dipentaerythritol hexakis(3-ethyl-3-oxetanylmethyl) ether, caprolactone-modified dipentaerythritol pentakis(3-ethyl-3-oxetanylmethyl) ether, ditrimethylolpropane tetrakis(3-ethyl-3-oxetanylmethyl) ether, EO-modified bisphenol A bis(3-ethyl-3-oxetanylmethyl) ether, PO-modified bisphenol A bis(3-ethyl-3-oxetanylmethyl) ether, EO-modified hydrogenated bisphenol A bis(3-ethyl-3-oxetanylmethyl) ether, PO-modified hydrogenated bisphenol A bis(3-ethyl-3-oxetanylmethyl) ether, and EO-modified bisphenol F (3-ethyl-3-oxetanylmethyl) ether.

These cation-polymerizable monomers may be used alone or in combination. EO denotes ethylene oxide, and an EO-modified compound has a block structure of an ethylene oxide group. PO denotes propylene oxide, and a PO-modified compound has a block structure of a propylene oxide group. The term "hydrogenated", as used herein, refers to the addition of hydrogen atoms to a C=C double bond, for example, of a benzene ring.

(Polymerization Initiator (b))

When the polymerizable monomer (a) is a radical-polymerizable monomer, the polymerization initiator (b) generates a radical by the action of light (infrared rays, visible light, ultraviolet light, far-ultraviolet light, X-rays, charged particle beams, such as an electron beam, or radioactive rays that can supply energy). When the polymerizable monomer (a) is a cation-polymerizable monomer, the polymerization initiator (b) generates an acid by the action of light.

Examples of the radical generator include, but are not limited to, optionally substituted 2,4,5-triarylimidazole dimers, such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, and 2-(o- or p-methoxyphenyl)-4,5-diphenylimidazole dimer;

benzophenone and benzophenone derivatives, such as N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone;

aromatic ketone derivatives, such as 2-benzyl-2-dimethylamino-1-(4-morpholinophenyl)-butanone-1,2-methyl-1-[4-(methylthio)phenyl]-2-morpholino-propanon-1-one;

quinones, such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthrenequinone, 2-methyl-1,4-naphthoquinone, and 2,3-dimethylanthraquinone;

benzoin ether derivatives, such as benzoin methyl ether, benzoin ethyl ether, and benzoin phenyl ether;

benzoin and benzoin derivatives, such as methylbenzoin, ethylbenzoin, and propylbenzoin;

benzyl derivatives, such as benzyl dimethyl ketal;

acridine derivatives, such as 9-phenylacridine and 1,7-bis (9,9'-acridinyl)heptane;

N-phenylglycine and N-phenylglycine derivatives;

acetophenone and acetophenone derivatives, such as 3-methylacetophenone, acetophenone benzyl ketal, 1-hydroxycyclohexyl phenyl ketone, and 2,2-dimethoxy-2-phenylacetophenone;

thioxanthone and thioxanthone derivatives, such as diethylthioxanthone, 2-isopropylthioxanthone, and 2-chlorothioxanthone;

xanthone, fluorenone, benzaldehyde, fluorene, anthraquinone, triphenylamine, carbazole, 1-(4-isopropylphenyl)-2-hydroxy-2-methylpropan-1-one, and 2-hydroxy-2-methyl-1-phenylpropan-1-one; and 2,4,6-trimethylbenzoyldiphenylphosphine oxide, and bis-(2,6-dimethoxybenzoyl)-2,4,4-trimethylpentylphosphine oxide.

These radical generators may be used alone or in combination.

The photo radical generator may be, but is not limited to, the following product: Irgacure 184, 369, 651, 500, 819, 907, 784, 2959, CGI-1700, -1750, or -1850, or CG24-61, or Darocur 1116 or 1173 (manufactured by Ciba Japan K.K.), Lucirin TPO, LR8893, or LR8970 (manufactured by BASF), or Ebecryl P36 (manufactured by UCB).

Examples of a compound used as a polymerization initiator that produces an acid by the action of light include, but are not limited to, onium salt compounds, sulfone compounds, sulfonate ester compounds, sulfonimide compounds, and diazomethane compounds.

Examples of the onium salt compounds include, but are not limited to, iodonium salts, sulfonium salts, phosphonium salts, diazonium salts, ammonium salts, and pyridinium salts. Specific examples of the onium salt compounds include, but are not limited to, bis(4-t-butylphenyl)iodonium perfluoro-n-butane sulfonate, bis(4-t-butylphenyl)iodonium trifluoromethane sulfonate, bis(4-t-butylphenyl)iodonium 2-trifluoromethylbenzene sulfonate, bis(4-t-butylphenyl)iodonium pyrene sulfonate, bis(4-t-butylphenyl)iodonium n-dodecylbenzene sulfonate, bis(4-t-butylphenyl)iodonium p-toluene sulfonate, bis(4-t-butylphenyl)iodonium benzene sulfonate, bis(4-t-butylphenyl)iodonium 10-camphorsulfonate, bis(4-t-butylphenyl)iodonium n-octane sulfonate, diphenyliodonium perfluoro-n-butane sulfonate, diphenyliodonium trifluoromethane sulfonate, diphenyliodonium 2-trifluoromethylbenzene sulfonate, diphenyliodonium pyrene sulfonate, diphenyliodonium n-dodecylbenzene sulfonate, diphenyliodonium p-toluene sulfonate, diphenyliodonium benzene sulfonate, diphenyliodonium 10-camphorsulfonate, diphenyliodonium n-octane sulfonate, triphenylsulfonium perfluoro-n-butane sulfonate, triphenylsulfonium trifluoromethane sulfonate, triphenylsulfonium 2-trifluoromethylbenzene sulfonate, triphenylsulfonium pyrene sulfonate, triphenylsulfonium n-dodecylbenzene sulfonate, triphenylsulfonium p-toluene sulfonate, triphenylsulfonium benzene sulfonate, triphenylsulfonium 10-camphorsulfonate, triphenylsulfonium n-octane sulfonate, diphenyl(4-t-butylphenyl)sulfonium perfluoro-n-butane sulfonate, diphenyl(4-t-butylphenyl)sulfonium trifluoromethane sulfonate, diphenyl(4-t-butylphenyl)sulfonium 2-trifluoromethylbenzene sulfonate, diphenyl(4-t-butylphenyl) sulfonium pyrene sulfonate, diphenyl(4-t-butylphenyl)

sulfonium n-dodecylbenzene sulfonate, diphenyl(4-t-butylphenyl)sulfonium p-toluene sulfonate, diphenyl(4-t-butylphenyl)sulfonium benzene sulfonate, diphenyl(4-t-butylphenyl)sulfonium 10-camphorsulfonate, diphenyl(4-t-butylphenyl)sulfonium n-octane sulfonate, tris(4-methoxyphenyl)sulfonium perfluoro-n-butane sulfonate, tris (4-methoxyphenyl)sulfonium trifluoromethane sulfonate, tris(4-methoxyphenyl)sulfonium 2-trifluoromethylbenzene sulfonate, tris(4-methoxyphenyl)sulfonium pyrene sulfonate, tris(4-methoxyphenyl)sulfonium n-dodecylbenzene sulfonate, tris(4-methoxyphenyl)sulfonium p-toluene sulfonate, tris(4-methoxyphenyl)sulfonium benzene sulfonate, tris(4-methoxyphenyl)sulfonium 10-camphorsulfonate, and tris(4-methoxyphenyl)sulfonium n-octane sulfonate.

Examples of the sulfone compounds include, but are not limited to, β-ketosulfones, β-sulfonylsulfones, and α-diazo compounds thereof. Specific examples of the sulfone compounds include, but are not limited to, phenacyl phenyl sulfone, mesityl phenacyl sulfone, bis(phenylsulfonyl)methane, and 4-trisphenacyl sulfone.

Examples of the sulfonate ester compounds include, but are not limited to, alkyl sulfonate esters, haloalkyl sulfonate esters, aryl sulfonate esters, and iminosulfonates. Specific examples of the sulfonate ester compounds include, but are not limited to, α-methylolbenzoin perfluoro-n-butane sulfonate, α-methylolbenzoin trifluoromethane sulfonate, and α-methylolbenzoin 2-trifluoromethylbenzene sulfonate.

Specific example of the sulfonimide compounds include, but are not limited to, N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicarboxyimide, N-(trifluoromethylsulfonyloxy)-7-oxabicyclo[2.2.1]hept-5-ene-2,3-dicarboxyimide, N-(trifluoromethylsulfonyloxy)bicyclo[2.2.1]heptan-5,6-oxy-2,3-dicarboxyimide, N-(trifluoromethylsulfonyloxy) naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-ene-2,3-dicarboxyimide, N-(10-camphorsulfonyloxy)-7-oxabicyclo[2.2.1]hept-5-ene-2,3-dicarboxyimide, N-(10-camphorsulfonyloxy)bicyclo[2.2.1]heptan-5,6-oxy-2,3-dicarboxyimide, N-(10-camphorsulfonyloxy)naphthylimide, N-(4-methylphenylsulfonyloxy)succinimide, N-(4-methylphenylsulfonyloxyl)phthalimide, N-(4-methylphenylsulfonyloxy)diphenylmaleimide, N-(4-methylphenylsulfonyloxyl)bicyclo[2.2.1]hept-5-ene-2,3-dicarboxyimide, N-(4-methylphenylsulfonyloxy)-7-oxabicyclo[2.2.1]hept-5-ene-2,3-dicarboxyimide, N-(4-methylphenylsulfonyloxyl)bicyclo[2.2.1]heptan-5,6-oxy-2,3-dicarboxyimide, N-(4-methylphenylsulfonyloxyl) naphthylimide, N-(2-trifluoromethylphenylsulfonyloxy)succinimide, N-(2-trifluoromethylphenylsulfonyloxyl)phthalimide, N-(2-trifluoromethylphenylsulfonyloxy)diphenylmaleimide, N-(2-trifluoromethylphenylsulfonyloxyl)bicyclo[2.2.1]hept-5-ene-2,3-dicarboxyimide, N-(2-trifluoromethylphenylsulfonyloxy)-7-oxabicyclo[2.2.1]hept-5-ene-2,3-dicarboxyimide, N-(2-trifluoromethylphenylsulfonyloxyl)bicyclo[2.2.1]heptan-5,6-oxy-2,3-dicarboxyimide, N-(2-trifluoromethylphenylsulfonyloxyl)naphthylimide, N-(4-fluorophenylsulfonyloxy)succinimide, N-(4-fluorophenyl)phthalimide, N-(4-fluorophenylsulfonyloxy)diphenylmaleimide, N-(4-fluorophenylsulfonyloxyl)bicyclo[2.2.1]hept-5-ene-2,3-dicarboxyimide, N-(4-fluorophenylsulfonyloxy)-7-oxabicyclo[2.2.1]hept-5-ene-2,3-dicarboxyimide, N-(4-fluorophenylsulfonyloxyl)bicyclo[2.2.1]heptan-5,6-oxy-2,3-dicarboxyimide, and N-(4-fluorophenylsulfonyloxyl)naphthylimide.

Specific examples of the diazomethane compounds include, but are not limited to, bis(trifluoromethylsulfonyl)diazomethane, bis(cyclohexylsulfonyl)diazomethane, bis (phenylsulfonyl)diazomethane, bis(p-toluenesulfonyl)diazomethane, methylsulfonyl p-toluenesulfonyldiazomethane, (cyclohexylsulfonyl)(1,1-dimethylethylsulfonyl)diazomethane, and bis(1,1-dimethylethylsulfonyl)diazomethane.

These acid generators may be used alone or in combination.

The polymerization initiator (b) component constitutes 0.01% by weight or more and 10% by weight or less, preferably 0.1% by weight or more and 7% by weight or less, of the amount of polymerizable monomer (a). Less than 0.01% by weight may result in a decreased curing rate and low reaction efficiency. On the other hand, more than 10% by weight may result in poor mechanical characteristics of a cured product of the curable composition.

(Other Additive Components)

In addition to the components described above, a curable composition according to an embodiment of the present invention may contain other additive components, such as a sensitizer, an antioxidant, a solvent, and/or a polymer component, for each purpose without losing the advantages of the present invention.

The sensitizer can promote a polymerization reaction and improve the reaction conversion. The sensitizer may be a hydrogen donor or a sensitizing dye.

The hydrogen donor can react with an initiator radical generated from the polymerization initiator (b) or a propagating radical to form a more reactive radical. The hydrogen donor can be added when the polymerization initiator (b) is a photo radical generator.

Specific examples of the hydrogen donor include, but are not limited to, amine compounds, such as N-butylamine, di-n-butylamine, tri-n-butylphosphine, allylthiourea, s-benzylisothiuronium-p-toluene sulfinate, triethylamine, dimethylaminoethyl methacrylate, triethylenetetramine, 4,4'-bis(dialkylamino)benzophenone, ethyl N,N-dimethylaminobenzoate, isoamyl N,N-dimethylaminobenzoate, pentyl-4-dimethylaminobenzoate, triethanolamine, and N-phenylglycine; and mercapto compounds, such as 2-mercapto-N-phenylbenzimidazole and mercaptopropionate.

The sensitizing dye is excited by absorbing light having a particular wavelength and acts on the polymerization initiator (b). The term "act on", as used herein, refers to energy transfer or electron transfer from the excited sensitizing dye to the polymerization initiator (b).

Specific examples of the sensitizing dye include, but are not limited to, anthracene derivatives, anthraquinone derivatives, pyrene derivatives, perylene derivatives, carbazole derivatives, benzophenone derivatives, thioxanthone derivatives, xanthone derivatives, thioxanthone derivatives, coumarin derivatives, phenothiazine derivatives, camphorquinone derivatives, acridine dyes, thiopyrylium salt dyes, merocyanine dyes, quinoline dyes, styrylquinoline dyes, ketocoumarin dyes, thioxanthene dyes, xanthene dyes, oxonol dyes, cyanine dyes, rhodamine dyes, and pyrylium salt dyes.

The sensitizer may be used alone or in combination.

The sensitizer in a curable composition according to an embodiment of the present invention preferably constitutes 0% to 20% by weight, more preferably 0.1% to 5.0% by weight, still more preferably 0.2% to 2.0% by weight, of the amount of polymerizable monomer (a). When the sensitizer content is 0.1% by weight or more, the effects of the sensitizer can be more effectively produced. When the sensitizer content is 5.0% by weight or less, a photo-cured product can have a sufficiently high molecular weight, and deterioration in solubility or storage stability can be prevented.

(Temperature of Curable Composition in Blending)

A curable composition according to an embodiment of the present invention may be mixed and dissolved at a temperature in the range of 0° C. to 100° C.

(Viscosity of Curable Composition)

A curable composition according to an embodiment of the present invention preferably has a viscosity in the range of 1 to 100 cP, more preferably 4 to 50 cP, still more preferably 4 to 20 cP, at 23° C. in the absence of solvent. A viscosity of more than 100 cP may result in a long filling time of the composition in a micropatterned depressed portion on a mold or patterning defects because of insufficient filling in an imprinting step described below. A viscosity of less than 1 cP may result in uneven coating in a coating step described below or the outflow of the composition from a mold in the imprinting step described below.

(Surface Tension of Curable Composition)

A curable composition according to an embodiment of the present invention preferably has a surface tension in the range of 5 to 70 mN/m, more preferably 5 to 35 mN/m, still more preferably 10 to 32 mN/m, at 23° C. in the absence of solvent. A surface tension of less than 5 mN/m results in a long charging time or poor charging of the composition in recessed and raised portions on a mold in a contact step described below. A surface tension of more than 70 mN/m tends to result in poor surface smoothness.

(Particulate Contaminant in Curable Composition)

In order to prevent defects in recessed and raised portions of a cured product of the polymerizable monomer (a) caused by particulate contaminants, after the components are mixed, a curable composition may be passed through a filter having a pore size in the range of 0.001 to 5.0 µm. The filtration may be performed in multiple steps or multiple times. A filtered liquid may be filtered again. The material of the filter may be, but is not limited to, polyethylene resin, polypropylene resin, fluoropolymer, or nylon resin.

(Metal Impurities in Curable Composition)

Metal impurities in a curable composition according to an embodiment of the present invention for use in the manufacture of semiconductor integrated circuits are minimized so as not to inhibit the operation of the circuits. Thus, the concentration of metal impurities in a curable composition according to an embodiment of the present invention is preferably 10 ppm or less, more preferably 100 ppb or less.

(Patterning Method)

A patterning method for forming a pattern on a substrate using a curable composition according to an embodiment of the present invention involves a placing step of placing the curable composition on the substrate, a mold contact step of bringing the curable composition into contact with a mold, a curing step of curing the curable composition in contact with the mold, and a demolding step of releasing the cured composition from the mold.

The present invention will be further described in the following embodiments with reference to the drawings.

As illustrated in FIG. 1, a patterning method according to an embodiment of the present invention involves a placing step of placing a curable composition on a substrate (FIG. 1(1)), a mold contact step of bringing the curable composition into contact with a mold (FIG. 1(2)), a photoirradiation step of irradiating the curable composition with light while the curable composition is in contact with the mold (FIG. 1(3)), and a demolding step of releasing the cured composition from the mold (FIG. 1(4)).

Although the curing step of curing the curable composition in contact with the mold is the photoirradiation step in the present embodiment, the curing step may be any step of partly or entirely curing the curable composition by supplying energy, such as heat, instead of irradiating the curable composition with radioactive rays (energy beams). In the photoirradiation step (3), the curable composition may be irradiated with light through the mold. The method may further involve an exposure step of etching part of a film of the curable composition remaining in depressed portions after the demolding step to expose a surface of the substrate in the depressed portions (FIG. 1(5)).

Each of the steps of a patterning method according to the present invention will be described below.

(Placing Step (FIG. 1(1)))

In the present embodiment, the placing step of placing a curable composition on a substrate to be processed is a coating step. A curable composition according to an embodiment of the present invention is applied to a substrate to be processed. The substrate to be processed may be a silicon wafer. The substrate to be processed may also be a substrate for semiconductor devices made of aluminum, a titanium-tungsten alloy, an aluminum-silicon alloy, an aluminum-copper-silicon alloy, silicon oxide, or silicon nitride. The substrate to be processed may be subjected to surface treatment, such as silane coupling treatment, silazane treatment, or the formation of an organic film, to improve adhesion to the curable composition. The curable composition may be applied by an ink jet method, a dip coating method, an air knife coating method, a curtain coating method, a wire bar coating method, a gravure coating method, an extrusion coating method, a spin coating method, or a slit scanning method. The film thickness of the curable composition depends on the application and may be in the range of 0.01 to 100.0 µm.

(Mold Contact Step (FIG. 1(2)))

In the mold contact step of bringing the curable composition into contact with a mold, recessed and raised portions (micropattern) on a surface of the mold are filled with the curable composition. The mold may be made of an optically transparent material, for example, glass, quartz, an optically transparent resin, such as PMMA or polycarbonate resin, a transparent metallized film, a soft film, such as a polydimethylsiloxane film, a photo-cured film, or a metal film.

A surface of the mold in contact with the curable composition may be hydrophilic so as to facilitate the formation of a polar bond with a fluorine-containing surfactant (c).

A mold for use in a patterning method according to an embodiment of the present invention may be subjected to surface treatment so as to improve the releasability of a cured composition from the mold. The surface treatment may involve the use of a silane coupling agent, such as a silicone or fluorinated coupling agent, for example, a commercially available coating-type mold-release agent, such as Optool DSX manufactured by Daikin Industries, Ltd.

The contact pressure is generally, but not limited to, in the range of 0.1 Pa to 100 MPa, preferably 0.1 Pa to 50 MPa, more preferably 0.1 Pa to 30 MPa, still more preferably 0.1 Pa to 20 MPa. The contact time is generally, but not limited to, in the range of 1 to 600 seconds, preferably 1 to 300 seconds, more preferably 1 to 180 seconds, still more preferably 1 to 120 seconds.

A patterning method according to an embodiment of the present invention may be performed in the atmosphere, under reduced pressure, or in an inert gas atmosphere. Specific examples of the inert gas include, but are not limited to, nitrogen, carbon dioxide, helium, argon, various chlorofluorocarbons, and mixtures thereof. The pressure may be in the range of 0.0001 to 10 atm. Use of reduced pressure or an inert gas atmosphere can eliminate the effects of oxygen or water on the photo-curing reaction.

(Photoirradiation Step (FIG. 1(3)))

In the photoirradiation step, the curable composition is irradiated with light while the curable composition is in contact with the mold. In this step, the curable composition in recessed and raised portions on the mold surface is cured.

The light is not particularly limited, depends on the sensitive wavelength of a curable composition according to an embodiment of the present invention, and may be ultraviolet light having a wavelength in the range of approximately 150 to 400 nm, X-rays, or an electron beam. Various photosensitive compounds sensitive to ultraviolet light are easily available as the polymerization initiator (b). Examples of ultraviolet light sources include, but are not limited to, high-pressure mercury lamps, ultrahigh-pressure mercury lamps, low-pressure mercury lamps, deep-UV lamps, carbon arc lamps, chemical lamps, metal halide lamps, xenon lamps, KrF excimer lasers, ArF excimer lasers, and $F_2$ excimer lasers. These light sources may be used alone or in combination. The curable composition may be entirely or partly irradiated with light.

If possible, the curable composition may further be cured with heat. The heating atmosphere and the heating temperature of heat curing are not particularly limited and may be an inert atmosphere or under reduced pressure and in the range of 40° C. to 200° C. Heating may be performed with a hot plate, an oven, or a furnace.

(Demolding Step (FIG. 1(4)))

In the demolding step, the curable composition is removed from the mold. In this step, the reverse pattern of the recessed and raised portions on the mold surface is transferred to a cured product of the curable composition.

The demolding method and the conditions for the demolding method are not particularly limited. For example, a substrate to be processed may be fixed while a mold may be moved away from the substrate to be processed, or a mold may be fixed while a substrate to be processed may be moved away from the mold, or a substrate to be processed and a mold may be moved in the opposite directions.

A patterning method according to an embodiment of the present invention may involve the use of a coating-type mold-release agent. More specifically, a coating-type mold-release agent layer may be formed on a patterned surface of a mold before the imprinting step.

Examples of the coating-type mold-release agent include, but are not limited to, silicon mold-release agents, fluorinated mold-release agents, polyethylene mold-release agents, polypropylene mold-release agents, paraffinic mold-release agents, montan mold-release agents, and carnauba mold-release agents. The mold-release agents may be used alone or in combination.

(Exposure Step (FIG. 1(5)))

In the exposure step, part of a film of the curable composition remaining in depressed portions is etched to expose a surface of the substrate in the depressed portions. The etching method is not particularly limited and may be a conventional method, such as dry etching. A known dry etching apparatus may be used in dry etching. The source gas for dry etching depends on the elementary composition of a film to be etched and may be an oxygen-containing gas, such as $O_2$, CO, or $CO_2$, an inert gas, such as He, $N_2$, or Ar, a chlorine gas, such as $Cl_2$ or $BCl_3$, $H_2$, or $NH_3$. These source gases may be used alone or in combination.

(Substrate Processing Step (FIG. 1(6)))

A pattern formed in the exposure step can be used as a film for an interlayer insulating film of a semiconductor device, such as LSI, system LSI, DRAM, SDRAM, RDRAM, or D-RDRAM, or a resist film in the manufacture of a semiconductor device.

More specifically, as illustrated in FIG. 1(6), the exposed portions in the exposure step may be subjected to etching or ion implantation to form a circuit structure based on the curable composition pattern on the substrate to be processed. A circuit board for a semiconductor device can be manufactured through these steps.

The curable composition pattern may be removed from the substrate or may be left as a member constituting the device.

The substrate may be used as an optical element, such as a DOE lens, having a textured pattern on its surface. More specifically, the substrate may be provided as an optical article that includes the substrate and a cured product of the curable composition on the substrate or as an electronic article, such as a DRAM device.

The present invention also includes a patterning method in which a curable composition according to an embodiment of the present invention is applied to a surface of a mold in advance.

In imprint lithography using a curable composition according to an embodiment of the present invention, a plurality of molds may be used as a mold assembly.

EXAMPLES

The present invention will be further described in the following examples. However, the technical scope of the present invention is not limited to these examples. Unless otherwise specified, "part" and "%" are based on weight.

Synthesis Example 1

Synthesis of Compound (c-1)

A 300-mL reactor was charged with hexa(ethylene glycol) (PEG 6, starting material A) (26.5 g, 93.9 mmol, 1.0 eq.), carbon tetrachloride ($CCl_4$) (36.1 g, 235 mmol, 2.5 eq.), and tetrahydrofuran (THF) (106 mL) in a nitrogen atmosphere and was cooled to −30° C. To this solution was slowly added dimethylaminophosphine (15.3 g, 93.9 mmol, 1.0 eq.) diluted with THF (24 mL) for two hours. After stirring for 30 minutes at that temperature, a cooling bath was removed, and the solution was stirred at room temperature for two hours. To this pale yellow suspension was added city water (250 mL) to separate the suspension into two layers ($CCl_4$ and aqueous layer). The aqueous layer was washed with isopropyl ether (IPE) (150 mL×2). A suspension of potassium hexafluorophosphate ($KPF_6$) (34.5 g, 188 mmol, 2.0 eq.) in city water (250 mL) was added to the aqueous layer and was sufficiently stirred. An organic layer extracted with dichloromethane (200 mL×3) was washed with city water (400 mL) and then with saturated saline (300 mL), was dried over anhydrous magnesium sulfate, and was concentrated to yield a light brown liquid (C-1-a) (53 g).

A 500-mL reactor was charged with a starting material B 1H,1H-perfluoro-1-heptanol (34.2 g, 97.7 mmol, 1.2 eq.) and THF (120 mL). To this solution was slowly added NaH (60%) (3.9 g, 97.7 mmol, 1.2 eq.) with attention to foaming. After stirring at 50° C. for one hour, the solvent was evaporated under reduced pressure. The liquid (C-1-a) (53 g) dissolved in anhydrous dioxane (600 mL) was added to the residue and was stirred at 60° C. for 48 hours. The suspension was concentrated, and city water (300 mL) and ethyl acetate (300 mL) were added to the resulting residue to separate the residue into two layers. An aqueous layer was extracted with ethyl acetate (200 mL×2). An organic layer was washed with city water (400 mL) and saturated saline (400 mL), was dried over anhydrous magnesium sulfate, and was concentrated to yield a brown liquid (59.1 g). The brown liquid was subjected to column purification ($SiO_2$: 1.2 kg, ethyl acetate alone=>ethyl acetate/methanol=10/1) and then column purification ($SiO_2$: 400 g, chloroform/methanol=15/1=>10/1) and was dried under high vacuum to yield a compound (c-1) hexa(ethylene glycol) mono-1H,1H-perfluoroheptyl ether ($F(CF_2)_6CH_2(OCH_2CH_2)_6OH$, 19.2 g, 31.2 mmol, yield 33%) as a colorless liquid.

Synthesis Example 2

Synthesis of Compound (d-1)

A 100-mL four-neck flask was charged with a starting material C tri(propylene glycol) (manufactured by Sigma-Aldrich Co.), $CCl_4$, and dehydrated THF and was cooled to a liquid temperature of −30° C. $P(Me_2)_3$ diluted with dehydrated THF (130 mL) was slowly added dropwise to the mixture for 20 minutes. After the dropwise addition, the mixture was stirred at −30° C. for 30 minutes and at room temperature for two hours. Water (50 mL) was added to separate the mixture. An aqueous layer was extracted with IPE (50 mL×2). $KPF_6$ was added to the aqueous layer. The aqueous layer was then stirred at room temperature for 30 minutes. An organic layer was extracted with methylene chloride (100 mL×2) from the aqueous layer. The organic layer was washed with water, was dried over sodium sulfate, and was concentrated to yield 21.1 g of an orange oil.

A starting material C 1H,1H-tridecafluoro-1-heptanol (manufactured by Wako Pure Chemical Industries, Ltd.) and dehydrated THF in a 3-L recovery flask were stirred at room temperature. NaH was slowly added to the mixture with attention to foaming. After the addition, the mixture was stirred and concentrated at an oil bath temperature of 40° C. for one hour. The orange oil diluted with dehydrated dioxane was added to the residue and was stirred overnight at an oil bath temperature of 60° C. The reaction solution was concentrated. The residue was quenched with water (100 mL). Extraction with ethyl acetate, washing with water and saline, dehydration with sodium sulfate, and concentration yielded a brown oil (79.6 g). The crude product was purified by silica gel column chromatography ($SiO_2$ 395 g, chloroform/methanol=40/1) and then by silica gel column chromatography ($SiO_2$ 390 g, heptane/ethyl acetate=2/1) to yield tri(propylene glycol) mono-1H,1H-perfluoroheptyl ether (d-1: $CF_3(CF_2)_5CH_2(OCH_2CH(CH_3))_3$—OH, 4.62 g, yield 16.9%) as a light brown oil. The structure of tri(propylene glycol) mono-1H,1H-perfluoroheptyl ether was identified by NMR.

Example 1

A mixed solution was prepared by using 100 parts by weight of 1,6-hexanediol diacrylate (manufactured by Osaka Organic Chemical Industry Ltd.) as the (a) component, 3 parts by weight of Irgacure 369 (manufactured by Ciba Japan K.K.) as the (b) component, 0.5 parts by weight of the compound (c-1) as the (c) component, and 0.13 parts by weight of the compound (d-1) as the (d) component. The mixed solution was passed through a 0.2 μm tetrafluoroethylene filter to prepare a curable composition according to Example 1. The surface tension of the curable composition was 25.6 mN/m as measured with an automatic surface tensiometer CBVP-A3 (manufactured by Kyowa Interface Science Co., Ltd.). The viscosity of the curable composition was 6.4 cP as measured with a cone-and-plate viscometer RE-85L (manufactured by Toki Sangyo Co., Ltd.). Measurement of Demolding Force 15 μl of the composition according to Example 1 was dropped with a micropipette on a 4-inch silicon wafer that had an adhesion-promoting layer having a thickness of 60 nm as an adhesion layer.

The silicon wafer was imprinted with a 40×40 mm quartz mold having no surface treatment and no pattern. An UV light source EXECURE 3000 (manufactured by Hoya Candeo Optronics Corp.) equipped with a 200-W mercury xenon lamp was used as an irradiation light source. An interference filter VPF-50C-10-25-36500 (manufactured by Sigmakoki Co., Ltd.) was placed between the light source and the quartz mold. The illuminance directly under the quartz mold was 1 mW/$cm^2$ at a wavelength of 365 nm.

Under these conditions, the photoirradiation step was performed for 60 seconds. In the demolding step, the quartz mold was raised at 0.5 mm/s. The demolding force was measured with a compact tension/compression load cell LUR-A-200NSA1 (manufactured by Kyowa Electronic Instruments Co., Ltd.). The demolding force was measured four times under the same conditions. The average demolding force of the second to fourth measurements was 121 N.

Comparative Example 1

A photo-curable composition having the same composition as Example 1 except that the compound (c-1) and the compound (d-1) were not used was prepared. Surface tension and demolding force were measured in the same manner as in Example 1. The average demolding force was 159 N, and the surface tension was 34.9 mN/m.

The relative demolding force was calculated using the following equation (1) from the average demolding force of the curable composition according to Example 1 and the average demolding force 159 N of the photo-curable composition according to Comparative Example 1.

[Math. 1]

$$\text{Relative demolding force} = \frac{\text{Average demolding force of composition containing fluorine-containing surfactant}}{\text{Average demolding force of composition not containing fluorine-containing surfactant}} \quad \text{Equation (1)}$$

The relative demolding force of Example 1 was 121 N/159 N=0.76.

Example 2

(a) component: 61.6 parts by weight of isobornyl acrylate (IB-XA manufactured by Kyoeisha Chemical Co., Ltd.), 10 parts by weight of (2-methyl-2-ethyl-1,3-dioxolan-4-yl)

methyl acrylate (MEDOL-10 manufactured by Osaka Organic Chemical Industry Ltd.), and 22.4 parts by weight of hexanediol diacrylate (Viscoat #230 manufactured by Osaka Organic Chemical Industry Ltd.).

(c) component c-2: 1.1 parts by weight of pentadeca (ethylene glycol) mono-1H,1H,2H,2H-perfluorooctyl ether $(CF_3(CF_2)_5CH_2CH_2(OCH_2CH_2)_{15}OH$, manufactured by DIC).

(d) component: 0.25 parts by weight of the compound (d-1). The other components were the same as in Example 1. A curable composition was prepared from these components. The surface tension and the demolding force of the curable composition were measured in the same manner as in Example 1. The surface tension was 27.3 mN/m, and the average demolding force was 91 N. In the absence of the (c) component and the (d) component, the average demolding force was 135 N. Thus, the relative demolding force was 0.68.

Example 3

(c) component c-2: 1.1 parts by weight of pentadeca (ethylene glycol) mono-1H,1H,2H,2H-perfluorooctyl ether $(CF_3(CF_2)_5CH_2CH_2(OCH_2CH_2)_{15}OH$, manufactured by DIC).

(d) component: 1.0 part by weight of the compound (d-1). Except for these, a curable composition was prepared in the same manner as in Example 2. The surface tension and the demolding force of the curable composition were measured in the same manner as in Example 1. The surface tension was 26.1 mN/m, and the average demolding force was 96 N. In the absence of the (c) component and the (d) component, the average demolding force was 135 N. Thus, the relative demolding force was 0.70.

Comparative Example 2

A curable composition according to Comparative Example 1 was prepared in the same manner as in Example 1 except that the compound (d-1) was not added as the (d) component. The surface tension and the demolding force of the curable composition were measured in the same manner as in Example 1. The surface tension was 25.5 mN/m, the average demolding force was 136 N, and the relative demolding force was 0.70.

Comparative Example 3

A curable composition according to Comparative Example 2 was prepared in the same manner as in Example 1 except that the (c) component was not added and that 0.5 parts by weight of the (d) component d-1 was added. The surface tension and the demolding force of the curable composition according to Comparative Example 2 were measured in the same manner as in Example 1. The surface tension was 27.0, the average demolding force was 142 N, and the relative demolding force was 1.05.

Comparative Example 4

A curable composition according to Comparative Example 4 was prepared in the same manner as in Example 3 except that the (d) component was not added. The surface tension and the demolding force of the curable composition according to Comparative Example 4 were measured in the same manner as in Example 1. The surface tension was 24.9 mN/m, the average demolding force was 99 N, and the relative demolding force was 0.73.

Comparative Example 5

A curable composition according to Comparative Example 5 was prepared in the same manner as in Example 2 except that the (c) component was not added. The surface tension and the demolding force of the curable composition according to Comparative Example 5 were measured in the same manner as in Example 1. The surface tension was 30.5 mN/m, the average demolding force was 137 N, and the relative demolding force was 1.28.

(Comparison of Surface Tension and Relative Demolding Force)

Table 1 summarizes the composition, the surface tension, the average demolding force, and the relative demolding force of the examples and the comparative examples.

TABLE 1

|  |  | Compound (a) | Compound (b) | Compound (c)/(Amount of addition) | Compound (d)/(Amount of addition) | Surface tension (mN/m) | Average demolding force (N) | Relative demolding force |
|---|---|---|---|---|---|---|---|---|
| Example | 1 | a-1 | b-1 | c-1 (0.5 parts by weight) | d-1 (0.13 parts by weight) | 25.6 | 121 | 0.76 |
|  | 2 | a-2 | b-1 | c-2 (1.1 parts by weight) | d-1 (0.25 parts by weight) | 27.3 | 91 | 0.68 |
|  | 3 | a-2 | b-1 | c-2 (1.1 parts by weight) | d-1 (1.0 part by weight) | 26.1 | 96 | 0.70 |
| Comparative example | 1 | a-1 | b-1 | — | — | 34.9 | 159 | 1 |
|  | 2 | a-1 | b-1 | c-1 (0.5 parts by weight) | — | 25.5 | 136 | 1.49 |
|  | 3 | a-1 | b-1 | — | d-1 (0.5 parts by weight) | 29.6 | 142 | 1.05 |
|  | 4 | a-2 | b-1 | c-2 (2.2 parts by weight) | — | 24.9 | 99 | 0.73 |
|  | 5 | a-2 | b-1 | — | d-1 (0.25 parts by weight) | 30.5 | 137 | 1.28 |

(Evaluation of Examples and Comparative Examples)

Examples 1 to 4 and Comparative Examples 1 to 5 were evaluated on the basis of surface tension, demolding force, and relative demolding force.

Example 1 had a much smaller relative demolding force than Comparative Example 1. Example 1 also had a smaller relative demolding force than Comparative Example 2, which employed the compound (c-1) alone, without a reduction in surface tension.

Example 1 had a much larger effect of decreasing demolding force than Comparative Examples 3 and 5, which employed the compound (d-1) alone. These results show that the photo-curable composition according to Example 1, which employed both the (c) component and the (d) component, had excellent mold releasability and surface tension (an evaluation item effective for filling), as compared with Comparative Examples that employed the (c) component or the (d) component alone.

Examples 2 and 3, which contained the (a) component and the (c) component different from these components in Example 1, had higher surface tension and a smaller relative demolding force than Comparative Example 4. Examples 2 and 3 had a much larger effect of decreasing demolding force than Comparative Example 5, which employed the compound (d-1) alone.

Example 4

Relationship Between Blend Ratio and Surface Tension

The amount of the (d) component d-1 of the mixed solution according to Example 2 was changed to 0.25, 0.5, or 1.0 part by weight. The surface tension of these mixed solutions was measured and was plotted as black dots in the graph in FIG. 2.

Likewise, in the mixed solution according to Example 2, the amount of the compound (c-1) was changed to 2.2 parts by weight, and the amount of the compound (d-1) of the (d) component was changed to 0.25 or 0.5 parts by weight.

Figure 2:
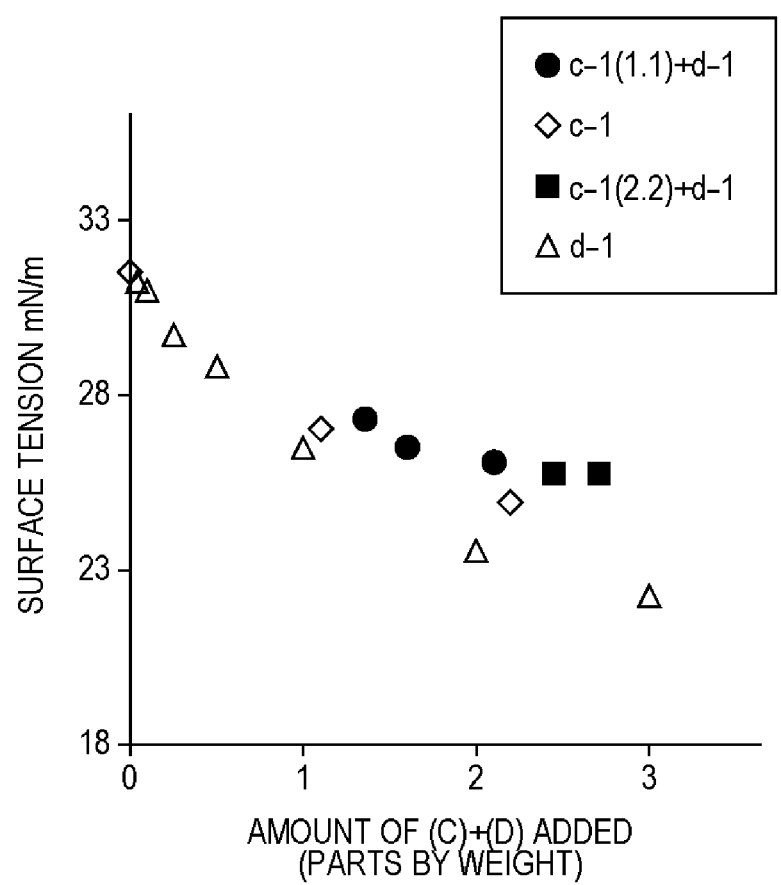
FIG. 2 is a graph of measurement results in Example 4.

The surface tension of these mixed solutions was measured and was plotted as black squares in the graph in FIG. 2.

The amount of the (c) component c-1 of the mixed solution according to Comparative Example 1 was changed to 0, 1.1, or 2.2 parts by weight. The surface tension of these mixed solutions was measured and was plotted as rhombuses in the graph in FIG. 2.

Likewise, the amount of the (d) component d-1 of the mixed solution according to Comparative Example 2 was changed to 0.05, 0.1, 0.25, 0.5, 1.0, 2.0, or 3.0 parts by weight. The surface tension of these mixed solutions was measured and was plotted as triangles in the graph in FIG. 2.

FIG. 2 shows that the weight ratio of the compound (c-2) to the compound (d-1) had little influence on surface tension. This indicates a high degree of flexibility in adjusting the material composition at different blend ratios.

In these mixed solutions, when the weight ratio of the compound having the general formula (1) to the compound having the general formula (2) was one or more, a decrease in demolding force and the suppression of a decrease in surface tension tended to become very noticeable. In particular, as shown in Examples 1 to 3, the weight ratio (the weight ratio of the general formula (1) to the general formula (2)) in the range of 1 to 5 had better results.

As described above, the addition of both of the fluorine-containing surfactants the (c) component and (d) component can realize a curable composition that has a small demolding force and suppresses a decrease in surface tension. Thus, a curable composition that requires a small demolding force and is easy to charge and a patterning method using the curable composition can be provided.

Advantageous Effects of Invention

The present invention provides a curable composition that requires a small demolding force and is easy to charge. The present invention also provides a patterning method that realizes a small demolding force and satisfactory filling.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-128996, filed Jun. 6, 2012, which is hereby incorporated by reference herein in its entirety.

The invention claimed is:

1. A curable composition, comprising: a polymerizable compound; and a polymerization initiator, wherein the polymerization initiator initiates polymerization to cure the polymerizable compound, and the curable composition further contains at least a compound having the following general formula (1) and a compound having the following general formula (2):

[Chem. 1]

(1)

[Chem. 2]

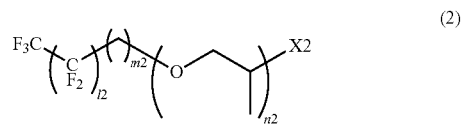

(2)

wherein X1 denotes a hydroxy group, l1 denotes an integer in the range of 0 to 7, m1 denotes 2, and n1 denotes an integer in the range of 1 to 16, and X2 denotes a hydroxy group, l2 denotes an integer in the range of 0 to 7, m2 denotes 1, and n2 denotes an integer in the range of 1 to 16, wherein the weight percentage of the compound having the general formula (1) is higher than the weight percentage of the compound having the general formula (2), and wherein the total concentration of the compound having the general formula (1) and the compound having the general formula (2) is equal to or more than 1.35 wt % wherein the curable composition has a surface tension of at least 26.1 mN/m.

2. The curable composition according to claim 1, wherein the curable composition is a photo-curable composition, which can polymerize by receiving light.

3. The curable composition according to claim 1 for use in UV nanoimprint lithography.

4. The curable composition according to claim 1, wherein the compound having the general formula (1) constitutes 1.1% to 5% by weight of the curable composition, and the compound having the general formula (2) constitutes 0.25% to 5% by weight of the curable composition.

5. The curable composition according to claim 1,
wherein the weight percentage of the compound having the general formula (1) is in the range of 0.1% to 5% by weight, the weight percentage of the compound having the general formula (2) is in the range of 0.01% to 5% by weight, and the weight percentage of the compound having the general formula (1) is equal to or higher than the compound having the general formula (2),
wherein, in the general formula (1), X1 denotes a hydroxy group, l1 denotes an integer in the range of 4 to 6, and n1 denotes an integer in the range of 5 to 7, and
wherein, in the general formula (2), X2 denotes a hydroxy group, l2 denotes an integer in the range of 4 to 6, and n2 denotes an integer in the range of 2 to 4.

6. The curable composition according to claim 1, wherein the compound having the general formula (1) is hexa(ethylene glycol) mono-1H,1H-perfluoroheptyl ether, and the compound having the general formula (2) is tri(propylene glycol) mono-1H,1H-perfluoroheptyl ether.

7. The curable composition according to claim 1, wherein the curable composition contains 1.1 wt % or less of the compound having the general formula (1) and 0.25 wt % or more of the compound having the general formula (2).

8. A patterning method for forming a pattern on a substrate using the curable composition according to claim 1, comprising:
placing the curable composition on the substrate;
bringing the curable composition into contact with a mold;
irradiating the curable composition with heat or light to cure the curable composition; and
releasing the cured composition from the mold.

9. The patterning method according to claim 8, wherein the mold is made of quartz.

10. The patterning method according to claim 8, wherein the curing involves irradiating the curable composition with light through the mold having recessed and raised portions on its surface.

11. A method for manufacturing a circuit board, comprising: etching or implanting ions into a substrate in accordance with a pattern formed by the patterning method according to claim 8, thereby forming a circuit structure on the substrate in accordance with the pattern.

12. The patterning method according to claim 8, wherein the curable composition is applied to a surface of the mold in advance.

* * * * *